United States Patent [19]

Grewe et al.

[11] Patent Number: 5,724,482
[45] Date of Patent: Mar. 3, 1998

[54] SMART TRAY FOR AUDIO PLAYER

[75] Inventors: Anthony James Grewe, Holmdel; Nuggehally Sampath Jayant, Gillette; Kevin Alan Shelby, Red Bank; Howard M. Singer, Marlboro, all of N.J.

[73] Assignee: Lucent Technologies Inc., Murray Hill, N.J.

[21] Appl. No.: 447,322

[22] Filed: May 22, 1995

[51] Int. Cl.[6] .............................. G10L 9/00; G11C 27/00
[52] U.S. Cl. .......................... 395/2.92; 365/45; 395/2.1; 395/2.79
[58] Field of Search ............................ 395/2.09, 2.1, 395/2.91, 2.92, 2.79; 365/1, 2, 45, 48, 49, 50

[56]  References Cited

U.S. PATENT DOCUMENTS

| | | | |
|---|---|---|---|
| 4,287,568 | 9/1981 | Lester | 365/2 |
| 4,318,188 | 3/1982 | Hoffmann | 365/45 |
| 4,717,261 | 1/1988 | Kita et al. | 368/63 |
| 4,772,873 | 9/1988 | Duncan | 341/110 |
| 4,881,205 | 11/1989 | Aihara | 365/45 |
| 4,890,259 | 12/1989 | Simko | 365/45 |
| 4,963,866 | 10/1990 | Duncan | 365/45 |
| 5,164,915 | 11/1992 | Blyth | 365/45 |

*Primary Examiner*—Tan Dinh

[57]  ABSTRACT

The present invention is a smart tray for an in-home audio player adapted to play pre-recorded music stored on a semiconductor music chip storage medium. Music chips are loaded into the smart tray which holds a predetermined number of chips and is inserted as part of the audio player. Each tray will have a low cost, low power microprocessor on board to handle routing and accessing of the music from an individual chip on the tray. For instance, the tray level microprocessor will be able to cue up a next song selection while a digital signal processor (DSP) within a base portion of the audio player finishes decoding the current selection. The smart tray minimizes music selection search times and allows the DSP to focus on processing the encoded music from the chips thereby minimizing housekeeping activities performed by the DSP and increasing efficiency. The smart tray allows for active music selections by the user so that the user can select a particular artist, song, music style, etc. with the touch of a button. This can be done since the music chips self-register content and music style to the smart tray upon power up. The audio player can be expanded by adding additional smart trays up to a predetermined limit.

20 Claims, 5 Drawing Sheets

5,724,482

SMART TRAY FOR AUDIO PLAYER

RELATED APPLICATIONS

The present patent application is related to U.S. patent application Ser. Nos. 08/447,337, 08/447,321 and 08/447,335, entitled respectively, Capacitive Interface For Coupling Between A Music Chip And Audio Player, Data Protocol For A Music Chip and Memory Chip Architecture and having filing dates of May 22, 1995, May 22, 1995 and Sep. 12, 1995, those applications having common inventors and assignees and being incorporated herein by reference.

FIELD OF THE INVENTION

The present invention relates to an audio player which utilizes semiconductor music chip storage elements, and more particularly to a music chip storage tray having a built-in processor to access and to decode information stored on the music chips.

BACKGROUND OF THE INVENTION

A variety of recording media exist today for the storage of consumer directed pre-recorded music and other audio applications. These media include CD ROM (Compact Disc Read Only Memory), DAT (Digital Audio Tape) and traditional magnetic cassette audio tape, just to name a few. Of the above technologies, the compact disc format has steadily increased in popularity and gained consumer approval due to the high sound quality of the digitally stored audio, as well as ease of use.

Compact discs and other formats, however, have some significant disadvantages. For one, compact discs do not normally include the ability to register the content of the information stored on disc prior to selection at the player. In other words, in order to gain any information regarding the contents of a particular music selection, that selection will first have to be manually selected at the player. In the alternative, some CD players may be manually programmed to play certain selections based upon user input. In either circumstance, however, there is no way to automatically search and play music by category, for example, by artist, music type, etc., unless a user has prior knowledge with regard to the selection. Such knowledge must include at a minimum the precise location of a selection on the recording medium, a way in which to direct the player apparatus to that location, and a searchable index keyed to the selection and the locations. Largely because of limitations in the recording medium, many of these functions cannot be accomplished cost effectively or efficiently.

An emerging technological innovation for the recording of consumer directed audio is the storage of pre-recorded audio on a medium known as semiconductor music chips. Digital data stored on the music chips is accessed by means of a solid state audio player having a digital signal processor which converts the stored digital data into audio signals. Up until recently the storage of digital data for reproduction of popular music albums on a single semiconductor chip was not viable because of the mount of memory needed and the costs associated with same. As data compression techniques have further developed, however, the storage of full length albums on modestly sized semiconductor chips has become a reality. In such a case, where music is digitally encoded on semiconductor memory devices, large quantities of data must be accessed and reliably transferred between the music chip and audio player. As multiple chips are added to a system the amount of memory to be accessed and data to be transferred greatly increases. Also as the number of chips expands so does the amount of search related and other "house-keeping" activity which must be performed by a processor to accommodate the data flow. In terms of a solid state audio system, the more house-keeping tasks a single processor undertakes, the less efficient it becomes at convening the stored digital data into audio signals, which in turn affects sound quality.

It is therefore an object of the present invention, to provide a system for the lo efficient playback of prerecorded music, wherein the processing capability of the audio equipment is effectively utilized. It is further an object of the present invention to provide an audio system, wherein general content and selection information from the recording medium are "self-registering" so that the information is readily available to the user without additional programming or set-up.

SUMMARY OF THE INVENTION

The present invention is a smart tray for an in-home audio player adapted to play pre-recorded music stored on a semiconductor music chip storage medium. In accordance with one embodiment of the invention, the audio player which utilizes the smart tray is a rack mounted type of device that aesthetically blends with a user's current entertainment system. Music chips are loaded into the smart tray which holds a predetermined number of chips and is inserted as part of the audio player. Each tray will have a low cost, low power microprocessor on board to handle routing and accessing of the music from an individual chip on the tray. For instance, the tray level microprocessor will be able to cue up a next song selection while a digital signal processor (DSP) within a base portion of the audio player finishes decoding the current selection. The smart tray minimizes music selection search times and allows the DSP to focus on processing the encoded music from the chips, thereby minimizing housekeeping activities performed by the DSP and increasing efficiency.

The smart tray allows for active music selections by the user so that the user can select a particular artist, song, music style, etc. with the touch of a button. This can be done since the music chips self-register content and music style information to the smart tray upon power up. A latent read scheme is employed within the smart tray to overcome delays associated in receiving data from the music chip over a contactless interface. In this scheme, data which is read from the data bus corresponds to an address issued in the previous read cycle. In this way data is always available for transfer from the tray processor to the DSP A command protocol exists within the audio player to facilitate communication between the base processor and tray processors. The base processor requests the play mode (e.g., sequential, random, content search, etc.), playback rate (e.g., normal play, paused, fast forward/reverse) and track selection. In response, the tray processor directs encoded data from the chip at the rate requested for playback. The tray processor is responsible for all address generation including that for fast/normal playback and access to the headers containing content information stored on each chip. The tray processor is also responsible for searching the header information in response to a specific request made through the base processor.

The base processor functions to monitor the user interface, for example, the keypad display and the remote, for command input using vectored interrupts and also decodes the bit stream received from the tray processors for playback. Utilizing this architecture, the base processor need not be aware of the chip/bit addressing being performed at the tray level. This also decouples the base processor from the specifics of the chip interface which increases efficiency and allows for a more conventional processor architecture. The audio player can be expanded by adding additional smart trays up to a predetermined limit.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION OF THE DRAWINGS

Figure 1:
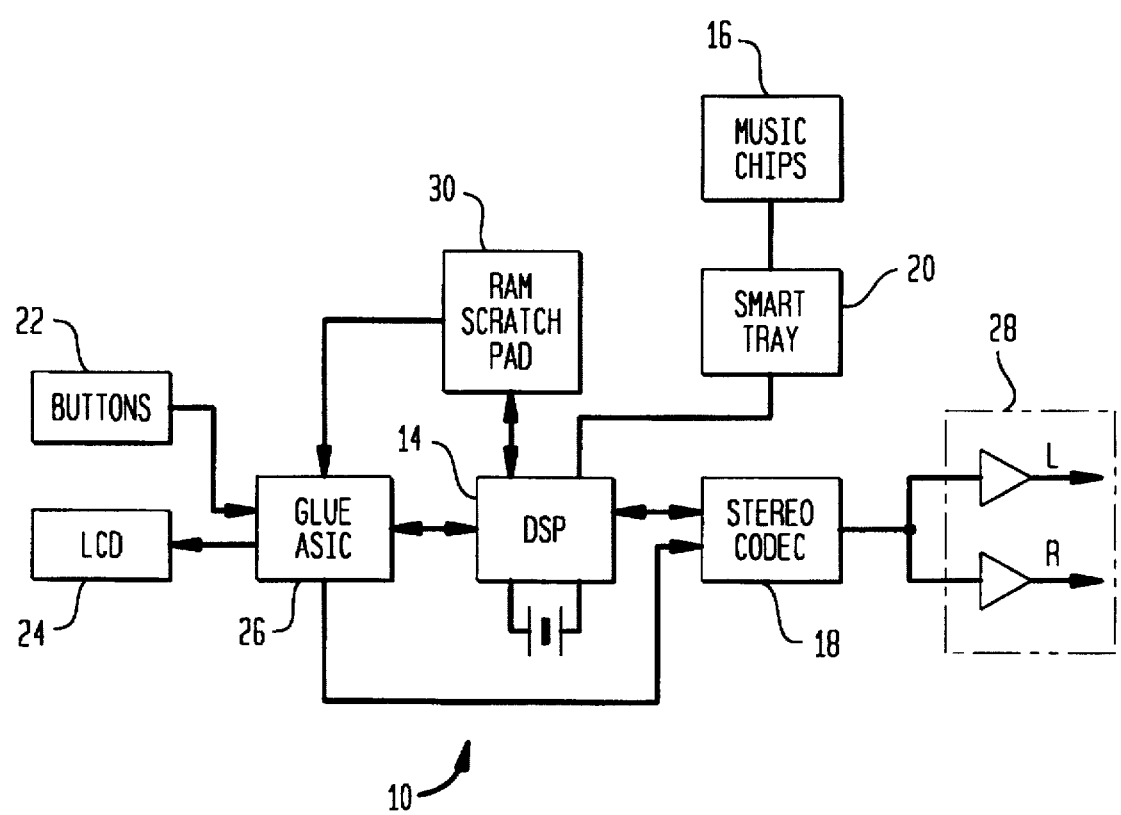
FIG. 1 shows a block diagram for one preferred embodiment of a solid state audio player used in conjunction with the present invention smart audio player tray.

The present invention "smart" audio player tray is used in a solid state audio system for providing communication between a semiconductor music chip recording medium having pre-recorded music stored thereon, and an audio player adapted for use with the chips. Referring to FIG. 1, there is shown a block diagram of one preferred embodiment of a solid state audio system 10 which utilizes the present invention smart tray 20 for holding music chips and interfacing with a base portion of an audio player 12 One or more music chips 16 are coupled to the audio player 12 by means of the smart tray 20. The audio player 12 is operated by means of a digital signal processor (DSP) 14 which communicates with the smart tray 20 in order to access information from the music chips. A suitable DSP, for example, for the music decoding operation of the audio player is DSP Model No. 1606 manufactured by the AT&T Corporation.

The music chips 16 are essentially memory devices having digital data stored thereon which corresponds to pre-recorded music. The pre-recorded audio data is stored on the chip 16 in a compressed format by means of an audio coding algorithm. The algorithm reduces the amount of digital information necessary to be stored from a master recording, while still reproducing essentially the same audio quality when the data is read back. Encoding by means of the algorithm is necessary in order to store sufficient quantities of data so that the music on the chips may have times of play comparable to that of current day albums. Other information pertaining to the musical content of the chip, including a music category, artist and specific addressing information, is stored in a series of headers which are downloaded to the audio player once the chip is loaded. For a more detailed explanation of the data storage protocol associated with the music chips, see related U.S. patent application Ser. No. 08/447,321, entitled Data Protocol for a Music Chip and having a filing date of May 22, 1995 and assigned to the present assignee herein.

As shown in FIG. 1, the main hardware architecture of the audio player 12 consists of, besides the DSP 14 and smart tray 20, a stereo coder/decoder (code) 18, keypad 22, display 24, and associated interface logic in the form of an applications specific integrated circuit (ASIC) 26. The keypad and display comprise the user interface which allows for the making of custom music selections. The audio player 12 is responsible for decoding the coded bit stream read from the music chip 16 and outputting the music through an output device, such as speakers or headphones 28. Parameters of the specific algorithm are downloaded into external RAM 30 when a chip 16 is loaded into the player 12 in order to assist in the decoding process.

Figure 2:
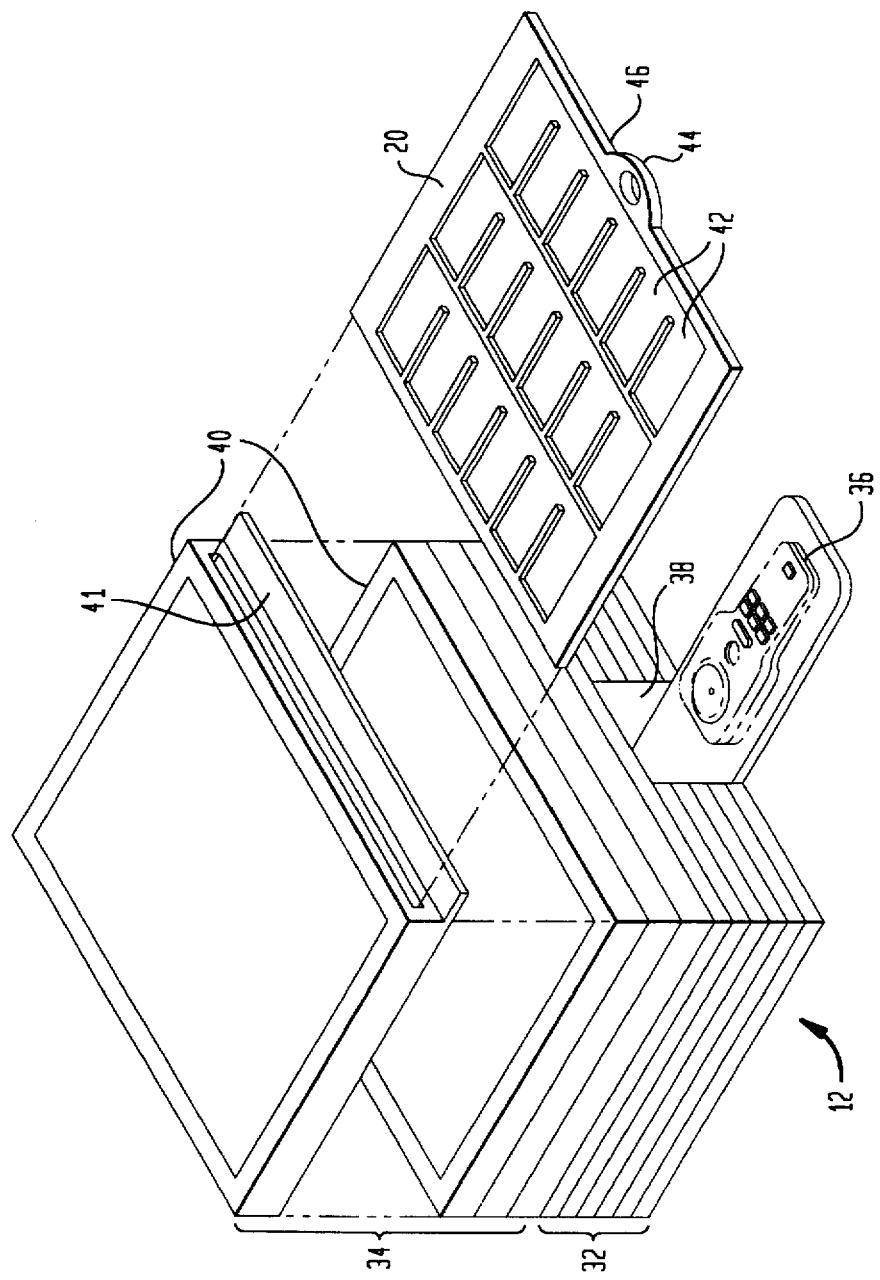
FIG. 2 shows one preferred embodiment of a solid state in-home audio player having the present invention smart trays incorporated therein.

Referring to FIG. 2 in connection with FIG. 1, there is shown an exemplary embodiment of the audio player 12, which utilizes the present invention smart tray 20. The player 12 is a semi-stationary device for home/commercial use and is intended to blend and connect with a user's current entertainment system. The player 12 includes a base portion 32 and a tiered upper portion 34 which includes the smart tray 20. The base portion houses the DSP 14, also referred to as the base processor, the code 18, and associated logic for interfacing with the user. A remote control unit 36 may also be included with the system as part of the user interface for performing user functions at a distance. The base portion 32 of the audio player includes a docking port 38 adapted to receive the remote control unit 36, wherein music selection information is uploaded to the remote in order that the user may perform intelligent selections.

Figure 2A:
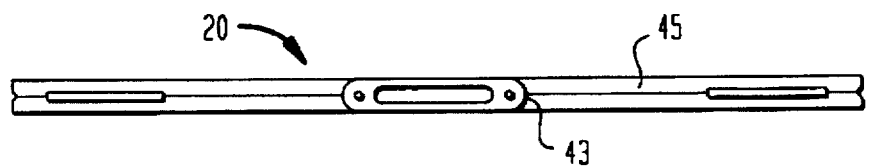
FIG. 2A shows a rear view of one preferred embodiment of the smart tray.
Figure 2B:
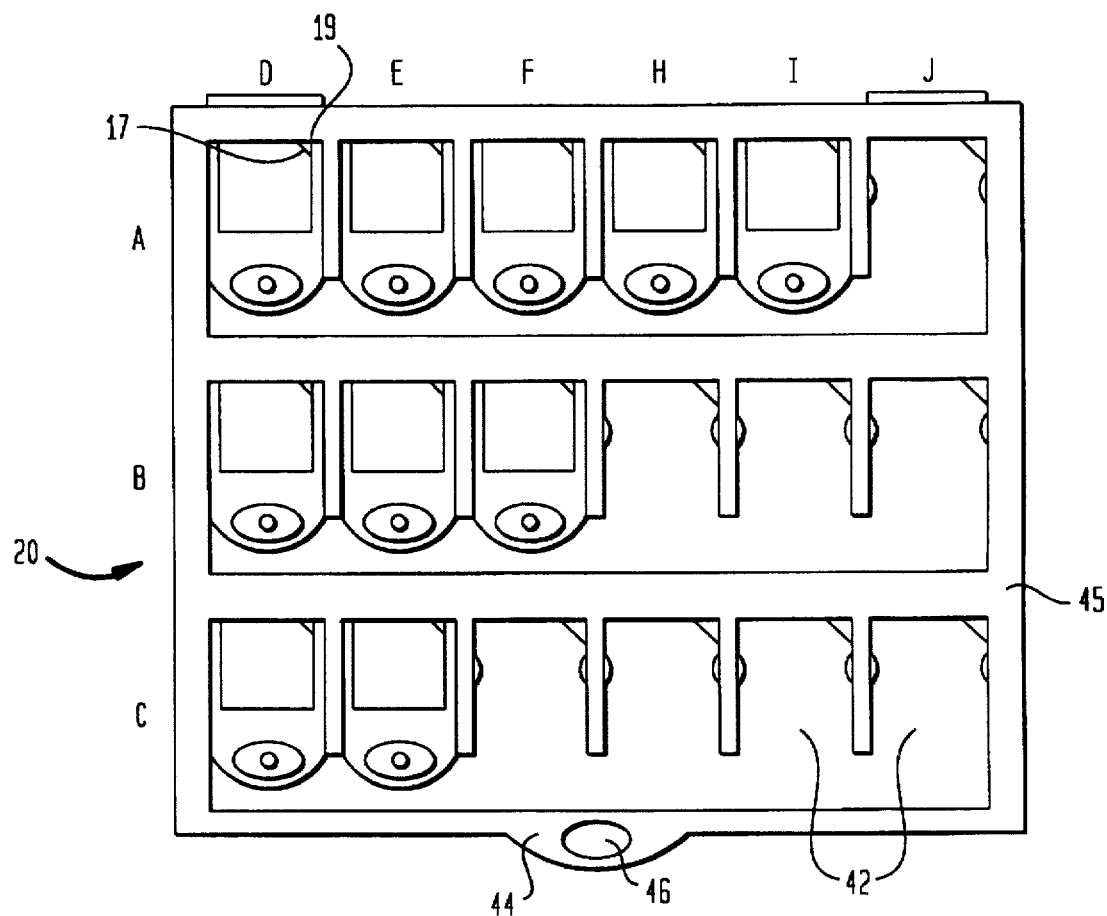
FIG. 2B shows a top plan view of the smart tray.

The upper tiered area 34 of the player as shown includes a plurality of music tray receptacles 40. The tray receptacles 40 are adapted to interconnect and stack on top of one another and also include a hollowed area 41 which is adapted to receive a music tray 20. The tray 20, for example, slides within the receptacle 40 and electrically couples with the player 12 by means of a connector 43 as shown in FIG. 2A. The design of the home audio player is intended to be flexible wherein additional trays 20 and tray receptacles 40, up to a finite number, can be easily plugged in and added as a user's collection of music chips grows. As shown in FIGS. 2, 2A and 2B in connection with one another, the music tray 20 is essentially a flat rectangular member having a plurality of receiving areas 42 for insertion of music chips. A pull tab handle 44 having an elliptical recess 46 is included for easy manipulation of the tray. The music tray may include a cover flap portion 45 which is hingedly connected to the tray and adapted to enclose the music chips. It will be understood, however, that the music tray and tray receptacle may also be combined into a single stackable device which couples one to another and allows for the storage of multiple music chips.

In a preferred embodiment of the invention, the receiving areas 42 of the tray 20 are arranged in matrix form, having three rows A,B,C and six columns D,E,F,H,I,J to accommodate up to 18 chips. It will be understood, however, that the smart tray may be designed to accommodate other numbers of music chips and that the smart tray invention need not be confined to 18 slots. An interface is included within each of the receiving areas 42 of the smart tray 20 for communicating individually with the music chips. In a preferred embodiment of the system 10 the music chips 16 communicate with the audio player 12 by means of a capacitive coupling produced when dielectric plates on the chip and tray are aligned in close proximity. Power and clock signals are provided to the chip 16 from the smart tray by contacts located on the sides of the receiving areas which bias and engage corresponding contacts on the chip when inserted. A notch 17 on the music chip 16 corresponds with a blocking area 19 on the chip receptacles 40 of the tray and ensures that the chip cannot be inserted incorrectly, thereby minimizing damage from a possible wrongful insertion. For a more detailed explanation of the communications interface between the audio player and music chips, see U.S. patent application Ser. No. 08/447,337, entitled Capacitive Interface for Coupling Between a Music Chip and Audio Player having a filing of May 22, 1995.

Figure 3:
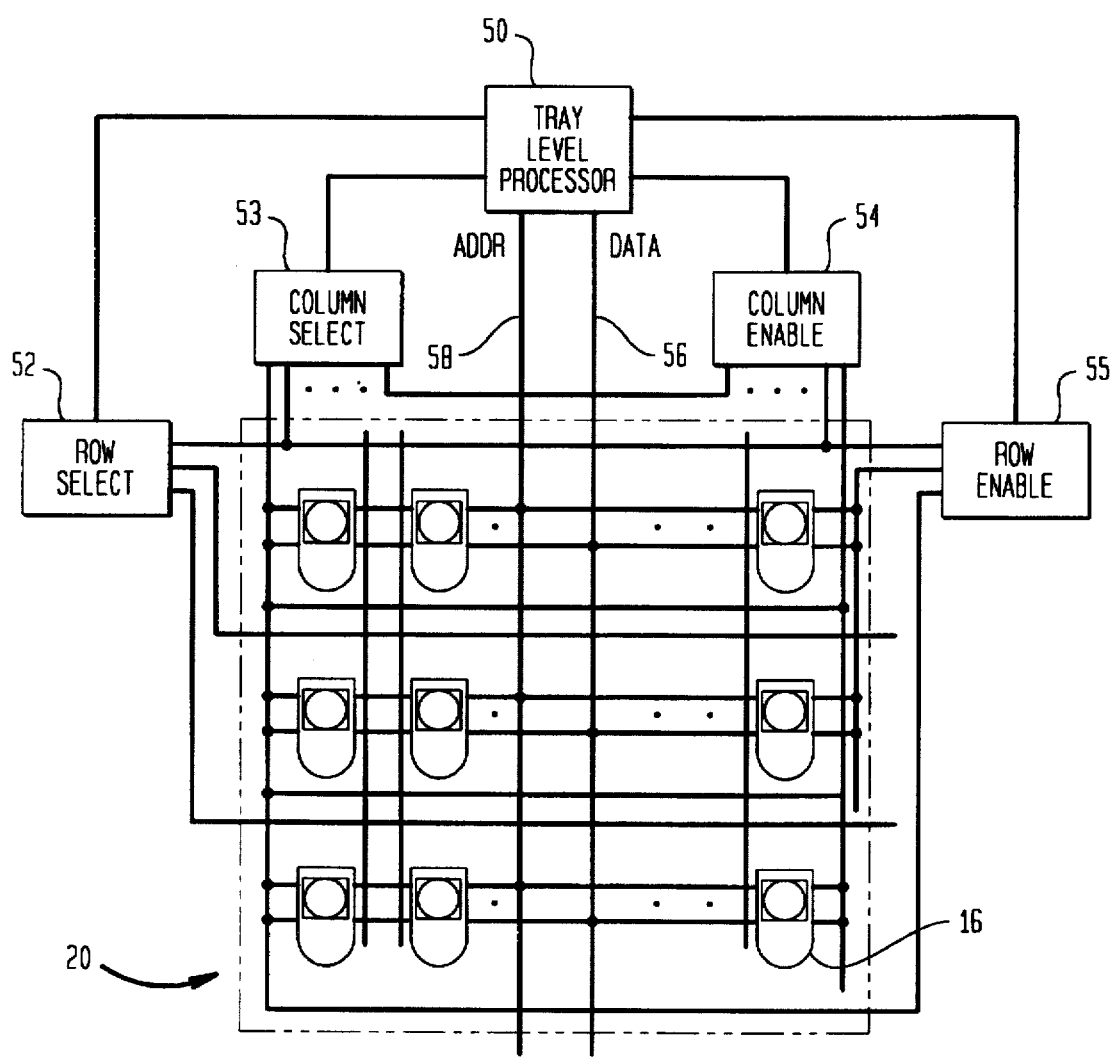
FIG. 3 shows a block diagram illustration of circuit architecture for the present invention smart tray.

Referring to FIG. 3, there is shown one preferred embodiment of the circuit architecture of the present invention smart audio player tray 20. As shown, the smart tray 20 is partially filled with music chips, wherein receiving areas 42 in columns D,E and J are occupied. As has been discussed, the smart tray is configured in a matrix-like format with each of the receiving areas being individually accessible by the base processor (DSP) 14. Each tray 20 contains a tray level processor 50 embedded within the housing of the smart tray to administer data transfer functions to the base level processor 14. The responsibilities of the tray processor 50 include issuing data addresses, providing row and column access strobes for accessing individual chips, and executing any header content search commands for information stored on a chip that is requested by the base processor. By utilizing the dedicated processor 50 of the smart tray 20 to essentially take care of house keeping activities on the associated tray level, search times are effectively minimized, and the DSP 14 is allowed to focus on implementing the algorithm for decoding the music data. This scheme is advantageous in terms of resource allocation in that lower level addressing activities are, in effect shielded from, and need not be handled by the DSP.

As mentioned, the tray level processor 50 is responsible for providing access strobes to the activated music chips. Accordingly, the tray level processor is shown coupled to respective decoders 52,53,54,55 for carrying out the access functions of the matrix, i.e., row select $R_S$, column select $C_S$, row enable $R_E$ and column enable $C_E$. An address and data bus 56,58 are included in the smart tray for transmission of data to and from the music chip 16.

The circuit architecture of a music chip 16 is similar to that of a flash EEPROM, wherein memory cell are individually addressable via a parallel address bus and data is read/written over a parallel data buss. The contents of the chip 16 are accessed by placing an address on the address bus 56 of the smart tray 20 and then activating the row and column select lines for the chip from which data is to be read. The data corresponding to that address appears on the data bus 58 of the smart tray after propagation over the data interface with the chip 16 to a data register, e.g., shift register.

Figure 4:
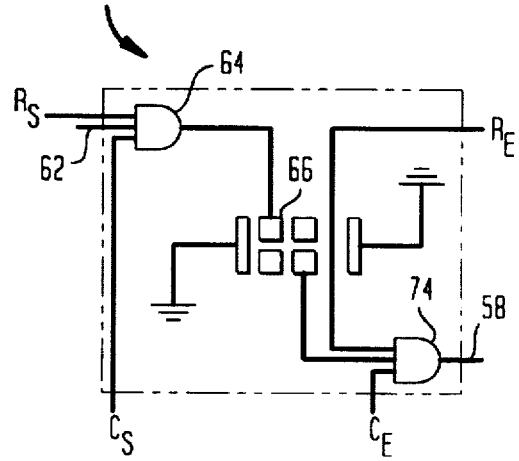
FIG. 4 shows a detailed view of an interface portion of a receiving area in the smart tray.

Referring to FIG. 4 in connection with FIG. 3, an exemplary representation of the interface portion 60 of a receiving area 42 of the smart tray 20 is shown. Access to the address bus 56 and data bus 58 of the smart tray is governed by chip select and output enable signals, $R_S$, $C_S$ and $R_E$, $C_E$, respectively. An address line 62 is coupled from the tray level processor to the input of an AND gate 64 along with row and column select lines $R_S$, $C_S$. The output of the AND gate 64 is coupled to an output terminal 66 of the smart tray for serial transmission of data to the music chip 16. Thus, both row and column select lines $R_S$, $C_S$ must be enabled in order to transmit an address through the AND gate 64 to the music chip 16. In a similar fashion, a data line 72 from the music chip is coupled to the input of a second AND gate 74 along with the row and column enable lines $R_E$, $C_E$ from the tray level processor 50. The output of the second AND gate 74 is coupled to the tray processor 50 through the data bus 58. In this case both row and column enable $R_E$, $C_E$ must be enabled for transmission of data through the second AND gate 74. Since the data flow over the interface 60 between the music chip 16 and smart tray 20 is transferred in a serial fashion, it will be understood that data registers, for example, shift registers, may be interposed between the interface 60 on the smart tray and the address and data buses 56,58 to accommodate the transition from parallel to serial data.

Both chip select and chip enable lines are included for access to a music chip in order to account for instances when the base processor 14 requests consecutive reads from separate storage chips. In this case, an address for the next data to be received would be issued to one chip through its $R_S$, $C_S$, while data is received by issuing $R_E$, $C_E$ to the previously addressed chip. Although logic gates 64,74 are shown in FIG. 4 as used to control the flow of data to and from the music chip, an alternative implementation is for the control signals to be present as active low enable signals on the data shift registers which are coupled to the address and data buses 56,58. In this way data transfer is inhibited from the shift registers unless the enable signals are present.

In accordance with the tray architecture just discussed, which utilizes chip select and chip enable lines, a latent read scheme is employed so as to overcome the delay in transmission of data from the music chip 16 over the contactless interface 60. In the latent read scheme, the data read from the data bus 58 corresponds to the address issued in the previous read cycle. In other words, the tray processor 50 issues an address during each read cycle that coincides with the next data it wishes to send the base processor 14. In the meantime, the tray processor 50 reads the data requested in the previous read cycle and transfers it to the base processor 14. In this manner, data is always immediately available for transfer from the tray processor since the previous cycle's data is cued up to be read.

Figure 5:
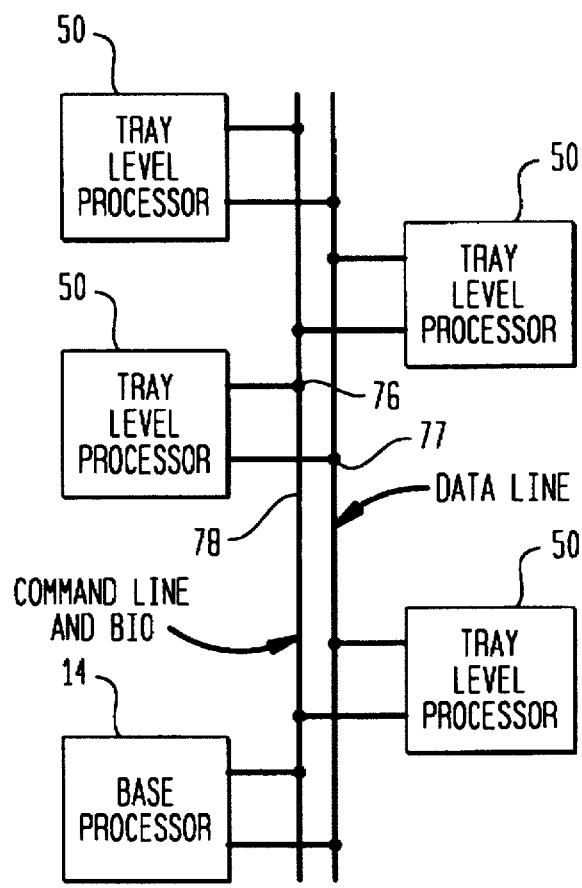
FIG. 5 illustrates the communication scheme between processors on the smart trays and the base digital signal processor.

Referring to FIG. 5, there is shown an illustration of the communications scheme between the base processor 14 and multiple tray level processors 50. As discussed previously, the solid state audio system 10 is an expandable system which is adapted for the add-on of multiple smart trays 20, up to a predetermined number. Each smart tray processor 50 communicates with the base processor 14 via separate communication and data ports 76,77. A bit input/output (BIO) scheme is employed to indicate an engaged, i.e., populated and powered, tray 20 to the base processor 14. Upon power up, each tray processor 50 asserts an engaged/ready line. A separate BIO line 78 is routed to the base processor for each tray slot. If a tray is absent at power up or is subsequently removed, the BIO line 78 is disengaged and no further communication is attempted with that tray.

A command protocol exists to facilitate communication between the base processor 14 and tray processors 50. The base processor 14 requests the play mode (e.g., sequential, random, content search, etc.), playback rate (e.g., normal play, paused, fast forward/reverse) and track selection. In response, the tray processor 50 directs encoded data from the chip 16 at the rate requested for playback. The tray processor is responsible for all address generation including that for fast/normal playback and access to the headers stored on each chip. The tray processor 50 is also responsible for searching the header information in response to a specific request made through the base processor 14.

The base processor 14 functions to monitor the user interface, for example, the keypad 22, display 24 and the remote 36, for command input using vectored interrupts and also decodes the bit stream received from the tray processors 50 for playback. Utilizing this architecture, the base processor 14 need not be aware of the chip/bit addressing being performed at the tray level 50. This also decouples the base processor from the specifics of the chip interface which increases efficiency and allows for a more conventional processor architecture.

Figure 6:
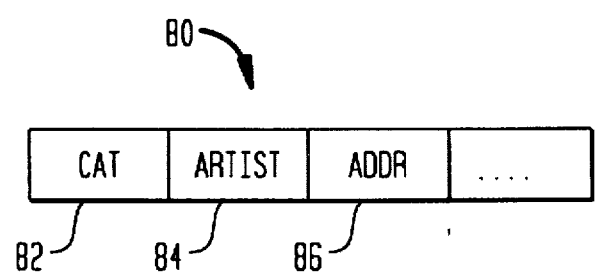
FIG. 6 shows an exemplary representation of an individual header stored within a music chip.

Each music chip that is inserted into the smart tray will have a section of memory allocated to a table of contents. Track selections on the chip will be listed as part of this table of contents by individual headers. The table of contents will include information on play times song titles, music category and artist. Providing this information allows the chip 16 to self-register when it is loaded into a smart tray 20 of the audio player 12. Referring to FIG. 6, there is shown one preferred embodiment of an individual header 80 which will correspond to a single track on the music chip 16. The individual header contains a music category 82 to which the track belongs, for example, classical, jazz, country, rock, etc. Also included in the individual header 80 is an artist field 84 and addressing information 86 for each track selection. Individual header information is self-registered with the RAM on the smart tray 20 once a chip 16 is inserted and powered up.

The individual header concept allows a user to maker music selections by category of music or artist which lends greater overall flexibility to the system. For example, a user may select to randomly hear Country Western songs over the course of an evening, or to hear songs from a specific artist, for example, Billy Joel. Music play may be performed randomly, sequentially, or by specific content as requested by the user. By having the music chips 16 self-register their content information within the memory of the smart trays 20 search time is minimized and the base processor DSP 14 is allowed to focus on decoding the encoded bit stream so that its house-keeping activities are minimized. Additionally, since a tray level processor 50 keeps track of what is on board its own tray, portability of the trays, i.e., removing trays from one player and installing them into another player, is done with minimal boot time.

From the above, it should be understood that the embodiments described, in regard to the drawings, are merely exemplary and that a person skilled in the art may make variations and modifications to the shown embodiments without departing from the spirit and scope of the invention. For example, it will be understood that the present invention smart tray may also be utilized with a portable box-type audio system, wherein the trays may be interchangeable between a home system and portable system. All such variations and modifications are intended to be included within the scope of the invention as defined in the appended claims.

What is claimed is:

1. A tray apparatus for use in an audio system, wherein pre-recorded music is digitally encoded in addressable memory of integrated circuit music chips and music from said chips is played on an associated solid state audio player which includes a processor, said tray apparatus comprising:

receiving means adapted to establish a communication with at least one of said music chips;

said receiving means further adapted for coupling said tray apparatus with said audio player; and processing means coupled to said receiving means, said processing means being operative to interface with said processor in said audio player and perform selected search commands requested by said processor with respect to information stored on said music chips, said processing means selectiveley accessing a track of said information stored on one of said music chips, said processing means also being adapted to provide a data path between said music chips and said digital signal processor for decoding of said pre-recorded music.

2. The tray apparatus of claim 1, wherein content information in the form of a music category, musical artist and addressing information, all pertaining to individual track selections on said music chips, are stored within a series of individual headers on said music chips, wherein said processing means of said tray apparatus is coupled to an associated random access memory, and wherein said content information stored in said series of individual headers is self-registered in said associated memory upon recognition by said audio player of a music chip inserted within said receiving means.

3. The tray apparatus of claim 2, wherein said processing means is operative to supply said content information and specific addresses with respect to said individual track selections to said processor upon request, thereby minimizing search related activities performed by said processor to enable more efficient decoding of said pre-recorded music stored within said music chips.

4. The tray apparatus of claim 1, wherein said receiving means includes a matrix of chip receptacles, said receiving means further including decoding means for enabling access by said processor means to individual ones of said music chips stored within said matrix of chip receptacles.

5. The tray apparatus of claim 4, wherein said decoding means includes a first and second set of enable lines to accommodate consecutive read requests from said processor for separate music chips, wherein a first said of enable lines is utilized for sending an address to a music chip and said second set of enable lines is used to receive data from said music chip.

6. The apparatus of claim 5, wherein said receiving means includes first and second data registers coupled to a communications interface in each of said matrix of chip receptacles, said data registers being coupled to said enable lines to thereby control data flow between individual ones of said music chips and said processor means.

7. The apparatus of claim 1, wherein said processing means is operative to employ a latent read scheme for reading data from said music chips to thereby account for any delay in transmission of data over a communications interface, whereby an address issued by said processing means during a current read cycle corresponds to data which said processing means wishes to send to said processor in a next read cycle.

8. The apparatus of claim 1, wherein said audio player is expandable to accommodate multiple trays and wherein a separate bit input/output (BIO) line is coupled between said processor and said processing means in each of said trays, whereby a tray indicates its presence to said processor by means of said BIO line.

9. The apparatus of claim 1, wherein said audio player includes at least one tray receptacle, said tray receptacle being adapted to stackably couple with another tray receptacle, and said receiving means comprising an essentially planar rectangular member, said rectangular member being adapted for insertion into said tray receptacle to thereby electrically couple with said audio player.

10. The apparatus of claim 1, wherein said receiving means includes means for capacitively coupling to said music chips thereby providing a contactless communications interface between said receiving means and said music chips.

11. A music chip storage apparatus for use in an audio player employing a hierarchical processing scheme, wherein a base processor decodes pre-recorded music stored on semiconductor music chips and issues requests from an interface with a user for content related information stored in a series of headers on said music chips, said music chip storage apparatus adapted to enable communications between said base processor and said music chips, said storage apparatus comprising:

storage tray means adapted to receive a group of music chips and establish communication with said music chips; and intermediate processing means included within said storage tray means, said intermediate processing means selectively accessing a track of said content related information stored on one of said music chips, said intermediate processing means further being operative to execute said requests issued by said base processor to thereby enable said base processor to allocate processing time to efficiently decode said pre-recorded music stored within said music chips.

12. The apparatus of claim 11, wherein said content information stored on said music chips includes a music category, musical artist, and addressing information related to individual tracks of audio stored on said music chips and wherein said intermediate processing means is coupled to associated memory, whereby said content information is automatically downloaded to said memory upon a music chip being engaged in said storage tray means.

13. The apparatus of claim 11, wherein said storage tray means includes a plurality of chip receptacles, said storage tray means further including decoding means for enabling access by said intermediate processing means to individual music chips stored in said plurality of chip receptacles.

14. The apparatus of claim 13, wherein said decoding means includes a set of chip select and chip enable lines individually coupled to each of said plurality of chip receptacles, wherein said intermediate processing means selectively enables said chip select and chip enable lines in order to perform consecutive read requests issued by said base processor.

15. The apparatus of claim 11, wherein said intermediate processing means is operative to employ a latent read scheme for reading data from said music chips to thereby account for any delay in transmission of data over a communications interface, whereby within said latent read scheme an address issued by said processing means during a current read cycle corresponds to data which said intermediate processing means wishes to send to said base processor in a next read cycle.

16. The apparatus of claim 11, wherein said base processor and said intermediate processing means communicate by way of a communications bus, said storage tray means including connection means for electrically coupling to said communications bus.

17. The apparatus of claim 11, wherein said storage tray comprises an essentially planar member, said planar member being adapted to stackably couple to another said planar member thereby facilitating expansion of said audio system.

18. The apparatus of claim 17, wherein said member includes a moveable top cover, said cover being hingedly attached to said planar member and adapted to enclose said music chips within said storage tray.

19. The apparatus of claim 14, wherein each of said chip receptacles includes respective data registers coupled to a communications interface, said date registers being coupled to said chip select and chip enable lines to thereby control data flow between individual ones of said music chips and said processing means.

20. The apparatus of claim 13, wherein said music chips include a notch at one end thereof to thereby identify an insertion end of a chip, and wherein said chip receptacles include a matching blocking means which corresponds to said notch on said music chips, whereby said blocking means prevents incorrect insertion of said music chips into said chip receptacles.

* * * * *